United States Patent
Takei

(10) Patent No.: US 8,319,209 B2
(45) Date of Patent: Nov. 27, 2012

(54) ORGANIC ELECTROLUMINESCENT DEVICE AND ELECTRONIC APPARATUS THAT CAN EFFECTIVELY RELEASE GAS THAT IS GENERATED

(75) Inventor: Shuichi Takei, Shimosuwa-machi (JP)

(73) Assignee: Seiko Epson Corporation, Tokyo (JP)

( * ) Notice: Subject to any disclaimer, the term of this patent is extended or adjusted under 35 U.S.C. 154(b) by 244 days.

(21) Appl. No.: 12/689,586

(22) Filed: Jan. 19, 2010

(65) Prior Publication Data
US 2010/0200875 A1 Aug. 12, 2010

(30) Foreign Application Priority Data
Feb. 6, 2009 (JP) ................. 2009-026364

(51) Int. Cl.
*H01L 51/50* (2006.01)
(52) U.S. Cl. .................... 257/40; 257/E51.02
(58) Field of Classification Search .............. 257/40, 257/E51.02
See application file for complete search history.

(56) References Cited

U.S. PATENT DOCUMENTS
7,755,281 B2 7/2010 Yasukawa

FOREIGN PATENT DOCUMENTS

| EP | 0 989 778 A1 | 3/2000 |
|---|---|---|
| JP | B2-3328297 | 9/2002 |
| JP | A-2003-123988 | 4/2003 |
| JP | A-2007-157470 | 6/2007 |
| JP | A-2007-273446 | 10/2007 |
| JP | A-2008-282602 | 11/2008 |
| WO | WO 2007125768 A1 * | 11/2007 |
| WO | WO 2008145999 A1 * | 12/2008 |

* cited by examiner

*Primary Examiner* — Thomas L Dickey
(74) *Attorney, Agent, or Firm* — Oliff & Berridge, PLC

(57) ABSTRACT

An organic electroluminescent device includes a substrate; a plurality of light-emitting elements disposed on the substrate and including first transparent electrodes, a second transparent electrode, and light-emitting layers held therebetween; reflective layers disposed opposite the light-emitting layers with the first electrodes therebetween; a first insulating film disposed between the substrate and the reflective layers and formed of an organic material; and a second insulating film disposed between the first electrodes and the reflective layers so as to cover the reflective layers and the first insulating film. The second insulating film has a first through-hole at a position not overlapping the first electrodes in plan view. The first through-hole extends through the second insulating film to reach the first insulating film.

8 Claims, 5 Drawing Sheets

ORGANIC ELECTROLUMINESCENT DEVICE AND ELECTRONIC APPARATUS THAT CAN EFFECTIVELY RELEASE GAS THAT IS GENERATED

BACKGROUND

1. Technical Field

The present invention relates to organic electroluminescent (EL) devices and electronic apparatuses.

2. Related Art

Organic EL devices having numerous organic EL elements on substrates are known in the related art. An organic EL device includes a planarizing layer covering components, such as thin-film transistors (TFTs) and wiring lines, formed on a substrate, electrodes (anodes) formed on the planarizing layer, a bank having openings separating the electrodes, functional layers formed in the openings of the bank, and an electrode (cathode) formed so as to cover the functional layers.

Extensive research and development has been conducted on organic EL devices with the growing need for low-power, lightweight flat displays, and various production methods and various device configurations with improved display characteristics have been proposed (see, for example, the specification of Japanese Patent No. 3,328,297 and JP-A-2003-123988).

For example, an organic EL device in the related art has a problem in that it cannot provide sufficient color reproducibility when applied to a display because light output from light-emitting layers has a wide spectral peak and low luminous intensity. Accordingly, it has been proposed to provide an optical cavity structure including reflective layers formed between a substrate and anodes and a transflective cathode formed on the output side of light-emitting layers so that light emitted from the light-emitting layers resonates between the reflective layers and the cathode (see JP-A-2008-282602). Because the reflective layers are often formed of a metal material, an insulating layer is formed between the anodes and the reflective layers to prevent a short circuit therebetween.

With the above structure, an organic EL device can output selectively amplified light of resonant wavelength toward the observer. This allows the use of light with a narrow spectral peak and high luminous intensity for display purposes, thus improving the color reproducibility of displays.

A planarizing layer in an organic EL device is usually formed by photolithography after dissolving a resin or resin precursor in a solvent and applying the solution. Therefore, the planarizing layer may contain residual solvent used in the formation of the planarizing layer. In addition, the planarizing layer is exposed to treatment liquids such as resist strippers used in the formation of layers other than the planarizing layer. Therefore, the planarizing layer may be impregnated with such treatment liquids.

The solvent and treatment liquid contained in the planarizing layer vaporizes with drive heat from the organic EL device or changes in the ambient temperature of the use environment. Such vaporization can also occur after the formation of highly hermetic layers, such as anodes and an insulating film formed of inorganic materials, on the planarizing layer. If vaporization occurs in the planarizing layer covered with the highly hermetic layers, the generated gas cannot be released and may damage the anodes and the insulating film as a result of volume expansion.

If the anodes are damaged, dark spots are formed at the damaged sites because no current flows there, thus degrading display quality. In addition, the generated gas may leak from the damaged sites and degrade functional layers such as light-emitting layers. This causes dark spots that grow around the damaged sites and spread as dead regions, thus significantly shortening a product life.

SUMMARY

An advantage of some aspects of the invention is that it provides an organic EL device that suffers no deterioration in display quality due to gas generated from a planarizing layer and also provides an electronic apparatus including such an organic EL device.

An organic EL device according to a first aspect of the invention includes a substrate; a plurality of light-emitting elements disposed on the substrate and including first transparent electrodes, a second transparent electrode, and light-emitting layers held therebetween; reflective layers disposed opposite the light-emitting layers with the first electrodes therebetween; a first insulating film disposed between the substrate and the reflective layers and formed of an organic material; and a second insulating film disposed between the first electrodes and the reflective layers so as to cover the reflective layers and the first insulating film. The second insulating film has a first through-hole at a position not overlapping the first electrodes in plan view. The first through-hole extends through the second insulating film to reach the first insulating film.

With the above structure, even if gas is generated from the first insulating film during the formation of the second insulating film, the generated gas is released to the outside of the first insulating film through the first through-hole. This avoids formation of dark spots due to accumulation of the gas generated from the first insulating film, thus providing an organic EL device that suffers no deterioration in display quality.

The organic EL device according to the first aspect of the invention preferably further includes a bank disposed on the second insulating film so as to separate the light-emitting elements and formed of an organic material, and the bank preferably overlaps the first through-hole in plan view and is in contact with the first insulating film through the first through-hole.

In this case, the gas released from the first through-hole can be released to the outside through the bank, which is formed of an organic material. This allows the gas to be released from the first through-hole during the production process following the formation of the second insulating film. For example, if the production process following the formation of the second insulating film includes heating the substrate, the rise in the temperature of the first insulating film promotes vaporization. The gas can then be released through the bank to prevent accumulation of the gas in the first insulating film.

In the first aspect of the invention, the bank preferably has a second through-hole extending through the bank so as to be connected to the first through-hole.

In this case, the gas generated from the first insulating film can be released to the outside of the bank more efficiently than by permeation through the bank.

In the first aspect of the invention, the first through-hole is preferably strip-shaped so as to extend along at least part of the bank.

In this case, the opening area of the first through-hole can be increased to more effectively release the gas generated from the first insulating film.

An electronic apparatus according to a second aspect of the invention includes the above organic EL device.

With the above structure, an electronic apparatus having superior reliability can be provided.

BRIEF DESCRIPTION OF THE DRAWINGS

The invention will be described with reference to the accompanying drawings, wherein like numbers reference like elements.

DESCRIPTION OF EXEMPLARY EMBODIMENTS

First Embodiment

Figure 1:
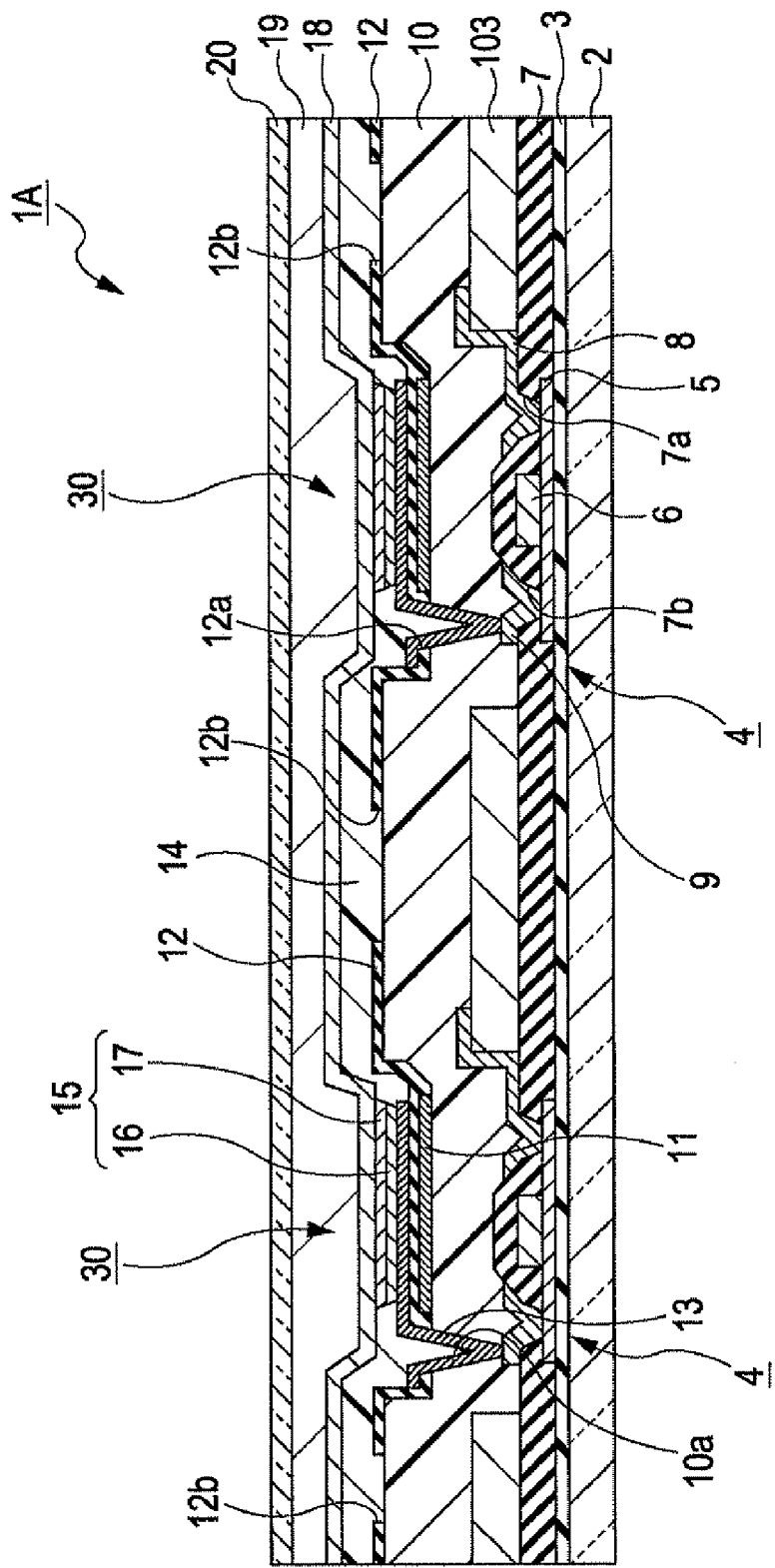
FIG. 1 is a sectional view of an organic EL device according to a first embodiment of the invention.

An organic EL device according to a first embodiment of the invention will now be described with reference to FIGS. 1 to 4. For clarity of the drawings, the thicknesses and sizes of individual components such as layers and parts are shown not to scale throughout all drawings so that they are large enough to be visible in the drawings.

Organic EL Device

First, an organic EL device 1A according to this embodiment will be described using FIGS. 1 and 2. FIG. 1 is a sectional view schematically showing the structure of the organic EL device 1A according to this embodiment. As shown, the organic EL device 1A according to this embodiment is a top-emission organic EL device in which light emitted from functional layers 15 of numerous organic EL elements (light-emitting elements) 30 formed on a substrate 2 is output from a sealing substrate 20 disposed opposite the substrate 2 on which the organic EL elements 30 are formed.

The substrate 2 is formed of, for example, glass, and an insulating film 3 of, for example, $SiO_2$ (silicon oxide) is formed on the substrate 2. Drive TFTs 4 corresponding to the individual organic EL elements 30 are disposed on the insulating film 3. The drive TFTs 4 include semiconductor layers 5 formed on the insulating film 3 and gate electrodes 6 disposed opposite channel regions of the semiconductor layers 5 with a gate insulating film (not shown) therebetween. An insulating film 7 is formed so as to cover the gate insulating film and the gate electrodes 6. Source electrodes 8 and drain electrodes 9 are formed on the insulating film 7. The source electrodes 8 are connected to source regions of the semiconductor layers 5 via contact holes 7a, whereas the drain electrodes 9 are connected to drain regions of the semiconductor layers 5 via contact holes 7b. The source electrodes 8 are connected to power lines 103 formed on the insulating film 7.

A planarizing layer (first insulating film) 10 is formed so as to cover the drive TFTs 4 and the power lines 103, thereby alleviating surface irregularities resulting from these components. The planarizing layer 10 is formed of, for example, a heat-resistant, insulating resin material (organic material) such as acrylic resin or polyimide. The planarizing layer 10 has contact holes 10a extending through the planarizing layer 10 to reach the drain electrodes 9.

A plurality of (in the drawings, two) reflective layers 11 are disposed on the planarizing layer 10. The reflective layers 11 are formed of a reflective metal material. The reflective metal material used may be, for example, aluminum (Al), silver (Ag), or an alloy mainly containing either, preferably, an alloy of aluminum and neodymium (Nd).

An interlayer insulating film (second insulating film) 12 is formed on the reflective layers 11 so as to cover the reflective layers 11 and the planarizing layer 10. The interlayer insulating film 12 is formed of an insulating inorganic material such as SiN or $SiO_2$. The interlayer insulating film 12 has contact holes 12a communicating with the contact holes 10a. In this embodiment, additionally, the interlayer insulating film 12 has through-holes (first through-hole) 12b extending through the interlayer insulating film 12 to reach the planarizing layer 10. The through-holes 12b will be described in detail later.

Pixel electrodes (first electrodes) 13 serving as anodes of the organic EL elements 30 are formed on the interlayer insulating film 12 so as to overlap the reflective layers 11 in plan view. The pixel electrodes 13 are preferably formed of a transparent conductive material having a high hole-injection effect with a work function of 5 eV or more. An example of a material having a high hole-injection effect is a metal oxide such as indium tin oxide (ITO). The pixel electrodes 13 are connected to the drain electrodes 9 via the contact holes 10a and 12a and cover portions of the planarizing layer 10 exposed in the contact holes 10a and 12a.

In addition, the organic EL elements 30 are disposed on the interlayer insulating film 12 in regions overlapping the reflective layers 11 in plan view, with the pixel electrodes 13 constituting parts of the organic EL elements 30. A bank 14 is formed between the adjacent organic EL elements 30 and between the organic EL elements 30 and the edges of the substrate 2. The bank 14 is formed of an insulating resin material, as is the planarizing layer 10. Because the bank 14 is formed by photolithography, the material used is an organic material such as a photosensitive acrylic resin or a cyclic olefin resin. The bank 14 is disposed so as to overlap the through-holes 12b and is in contact with the planarizing layer 10 through the through-holes 12b.

The organic EL elements 30 are configured such that the functional layers 15 are held between the pixel electrodes 13 and a cathode 18. The functional layers 15 disposed on the pixel electrodes 13 include hole-injection/transport layers 16 formed on the pixel electrode 13 side and light-emitting layers 17 formed thereon.

The hole-injection/transport layers 16 are formed by drying a liquid material such as a dispersion of 3,4-polyethylenedioxythiophene-polystyrenesulfonate (PEDOT-PSS). Other known materials with hole-injection/transport properties can also be used.

The light-emitting layers 17 are formed of known light-emitting materials that can emit fluorescence or phosphorescence. For full-color display, particularly, materials that emit light corresponding to the red, green, and blue wavelength ranges are used.

Preferred examples of the materials used to form the light-emitting layers 17 include polyfluorene derivatives (PF), poly (p-phenylenevinylene) derivatives (PPV), polyphenylene derivatives (PP), poly(p-phenylene) derivatives (PPP), polyvinylcarbazole (PVK), polythiophene derivatives, and polysilanes such as polymethylphenylsilane (PMPS). These polymer materials may be doped with a polymer material such as a perylene dye, a coumarin dye, or a rhodamine dye or a low-molecular-weight material such as rubrene, perylene, 9,10-diphenylanthracene, tetraphenylbutadiene, Nile red, coumarin 6, or quinacridone. In addition, phosphorescent materials such as Ir(ppy)$_3$ can be used.

The cathode (second electrode) 18 of the organic EL elements 30 is disposed on the functional layers 15 so as to cover the surfaces of the functional layers 15 and the bank 14. The cathode 18 functions as a transflective layer that transmits some of light reaching the surface thereof while reflecting the rest. Specifically, the cathode 18 is formed of a multilayer film including a lithium fluoride (LiF) film formed by vacuum deposition and having a thickness of about 5 nm and a magnesium-silver (Mg—Ag) alloy film formed thereon by codeposition and having a thickness of about 10 nm. In addition to the above materials, conductive materials having electron injection properties, such as calcium (Ca) and barium (Ba), can be used for the cathode 18.

If a sufficiently thin film is formed using such a conductive material, the film has transflective properties; that is, the film is transparent but actually reflects some light. Thus, the cathode 18 functions as a transflective layer. Accordingly, an optical cavity structure is formed between the cathode 18, serving as a transflective layer, and the reflective layers 11 disposed under the pixel electrodes 13.

That is, light emitted from the light-emitting layers 17 of the functional layers 15 is repeatedly reflected and therefore resonates between the reflective layers 11 and the transflective cathode 18. This causes only a component with the resonant wavelength of the cavity structure to be selectively amplified, transmitted through the cathode 18, and output to the outside (toward the observer). Accordingly, this structure can emit light with a narrow spectral peak and high intensity.

The sealing substrate 20 is formed of a transparent material such as glass or quartz and is bonded to the cathode 18 with a transparent adhesive layer 19 therebetween. Although a transflective electrode is used as the cathode 18 so that an optical cavity structure is formed between the cathode 18 and the reflective layers 11 in this embodiment, a transparent electrode may instead be used as the cathode 18 so that no optical cavity structure is formed.

Through-Holes of Interlayer Insulating Film

Because the planarizing layer 10 of the organic EL device 1A is usually formed using an organic material by a wet process, the planarizing layer 10 is impregnated with a small amount of solvent and developer used in the formation of the planarizing layer 10. In addition, the planarizing layer 10 is often brought in contact with solvents such as resist strippers and developers used in the formation of the layers above the planarizing layer 10 and tends to swell with the solvents.

The solvent contained in the planarizing layer 10 expands inside the planarizing layer 10 through vaporization due to drive heat generated when the organic EL device 1A is used or the temperature of the use environment. The organic EL device 1A according to this embodiment allows the generated gas, which tends to damage pixel electrodes or degrade functional layers, to be released through the through-holes 12b formed in the interlayer insulating film 12, thus preventing such damage.

Figure 2A:
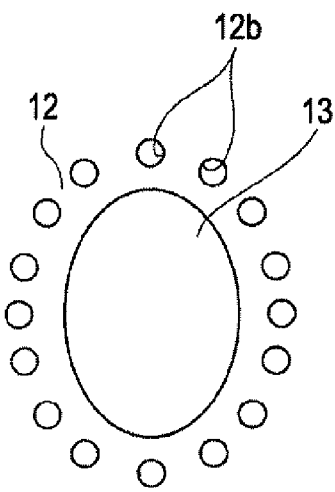
FIGS. 2A to 2C are schematic plan views of various arrangements of through-holes in the first embodiment of the invention.
Figure 2B:
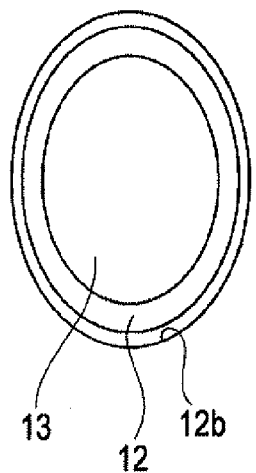
Figure 2C:
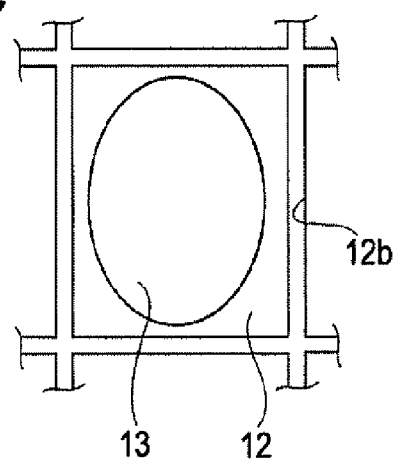

FIGS. 2A to 2C are schematic plan views of various through-holes 12b formed in the interlayer insulating film 12. It is possible to form a single through-hole 12b in the interlayer insulating film 12, to form dot-shaped through-holes 12b so as to surround the pixel electrodes 13 in plan view, as shown in FIG. 2A, or to form groove-shaped through-holes 12b continuously around the pixel electrodes 13, as shown in FIG. 2E. It is also possible to form groove-shaped through-holes 12b continuously around the pixel electrodes 13 in a grid pattern along part of the bank 14, as shown in FIG. 2C.

The through-holes 12b are formed near the pixel electrodes 13 so that they can smoothly release the gas generated from the planarizing layer 10 near the pixel electrodes 13 to prevent damage to the pixel electrodes 13. The through-holes 12b preferably have a larger opening area so that the gas can be more efficiently released.

The organic EL device 1A according to this embodiment is configured as described above.

Method for Producing Organic EL Device

Next, a method for producing the organic EL device 1A and advantages of this embodiment will be described. FIGS. 3A to 3C and 4A and 4B are diagrams showing a process of producing the organic EL device 1A according to this embodiment.

Figure 3A:
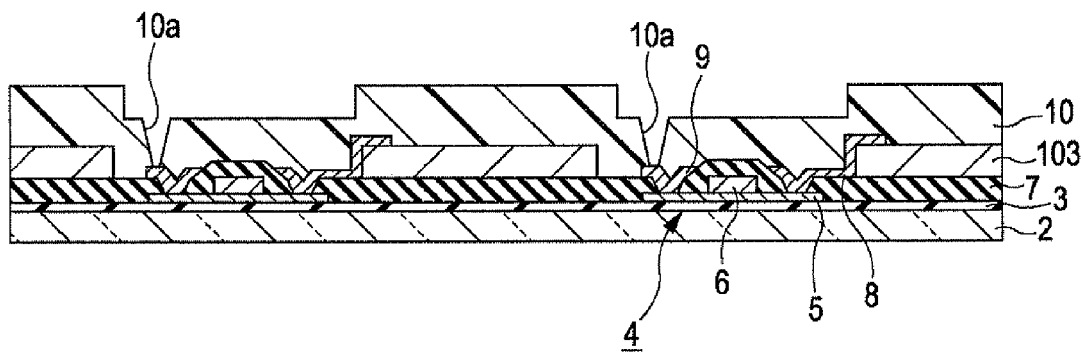
FIGS. 3A to 3C are sectional views showing a process of producing the organic EL device according to the first embodiment of the invention.

Referring to FIG. 3A, first, the planarizing layer 10 is formed on the substrate 2 on which the components such as the drive TFTs 4, the gate electrodes 6, the source electrodes 8, the drain electrodes 9, and the power lines 103 are formed. The planarizing layer 10 having the contact holes 10a are formed by, for example, applying and drying a solution of a photocurable resin precursor by spin coating and subjecting the resultant precursor film to exposure and development (photolithography).

Figure 3B:
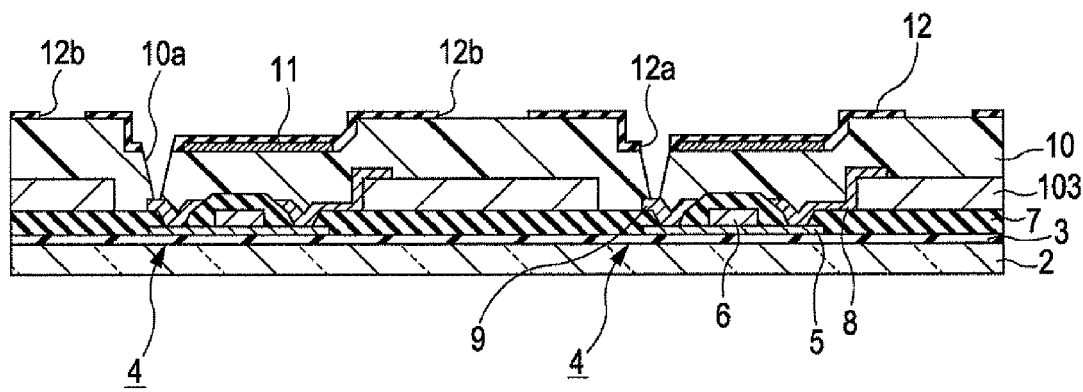

Referring to FIG. 3B, the reflective layers 11 are formed on the planarizing layer 10 by, for example, mask deposition, and the interlayer insulating film 12 is formed so as to cover the reflective layers 11. The interlayer insulating film 12 is formed by, for example, depositing a SiN film on the entire surface and forming the contact holes 12a and the through-holes 12b by wet etching.

Figure 3C:
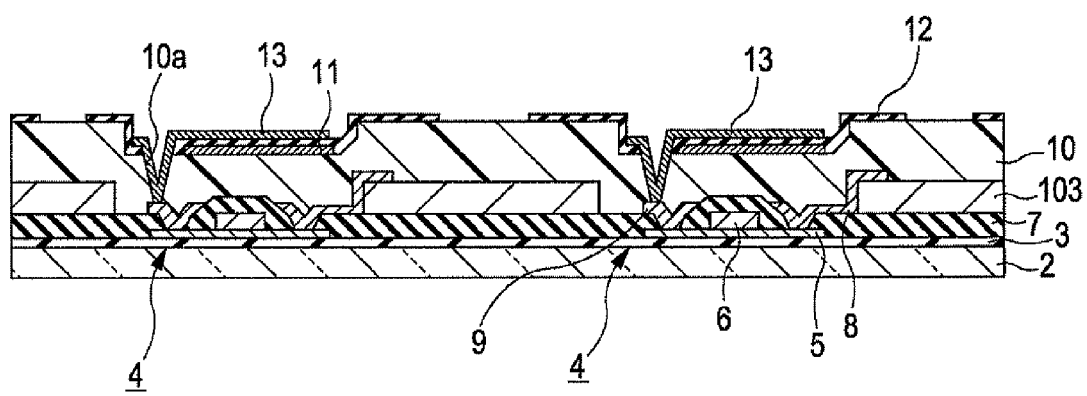

Referring to FIG. 3C, the pixel electrodes 13 are formed on the interlayer insulating film 12 so as to be connected to the drain electrodes 9 via the contact holes 10a and 12a.

Figure 4A:
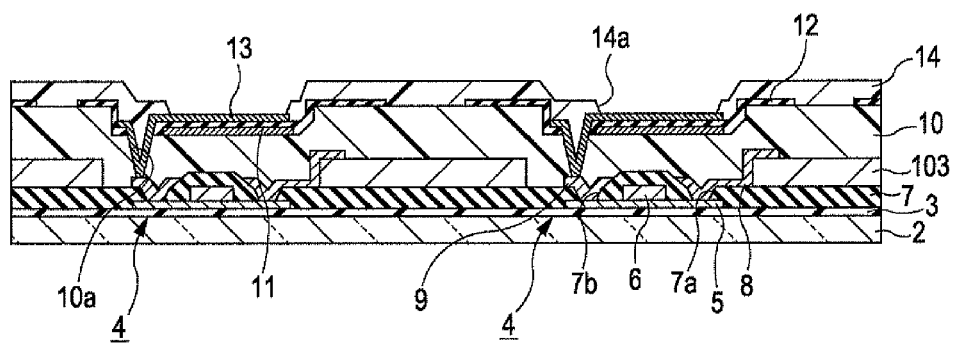
FIGS. 4A and 4B are sectional views showing the process of producing the organic EL device according to the first embodiment of the invention.

Referring to FIG. 4A, an organic material layer is formed so as to cover the planarizing layer 10, the pixel electrodes 13, and the interlayer insulating film 12, and openings 14a are formed in the organic material layer by photolithography to form the bank 14. After the formation of the bank 14, the entire substrate 2 is annealed by heating at, for example, about 200° C.

Figure 4B:
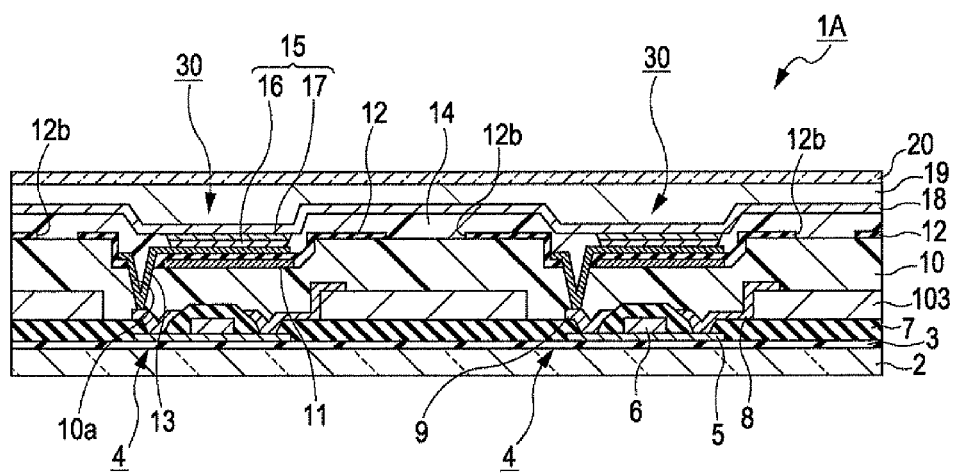

Referring to FIG. 4B, the functional layers 15 and the cathode 18 are formed by known methods to form the organic EL elements 30, and the sealing substrate 20 is bonded thereto with the adhesive layer 19 therebetween. Thus, the organic EL device 1A according to this embodiment can be produced.

During the treatment such as deposition, plasma treatment, and annealing in the above production process, the planarizing layer 10 of the organic EL device 1A is heated to the individual treatment temperatures, so that the solvent contained in the planarizing layer 10 vaporizes. Before the formation of the bank 14, the generated gas is released to the outside of the planarizing layer 10 directly via the through-holes 12b formed in the interlayer insulating film 12. In addition, the bank 14, formed of a resin material, has low gas barrier properties. After the formation of the bank 14, therefore, the generated gas is released to the outside of the planarizing layer 10 by permeation through the bank 14. This prevents damage to the pixel electrodes 13 due to the generated gas, thus avoiding formation of dark spots.

The organic EL device 1A according to this embodiment is produced as described above.

In the organic EL device 1A having the above structure, even if gas is generated from the planarizing layer 10 during the formation of the interlayer insulating film 12, the generated gas is released to the outside of the planarizing layer 10 through the through-holes 12b. This avoids formation of dark spots, thus providing an organic EL device 1A that suffers no deterioration in display quality.

In this embodiment, additionally, the bank 14 overlaps the through-holes 12b in plan view and is in contact with the planarizing layer 10 through the through-holes 12b. Accordingly, the gas released from the through-holes 12b can be released to the outside through the bank 14. This allows the gas to be released from the through-holes 12b during the production process following the formation of the interlayer insulating film 12.

Although the functional layers 15 are formed of polymer light-emitting materials in this embodiment, known low-molecular-weight materials can also be used.

Second Embodiment

Figure 5:
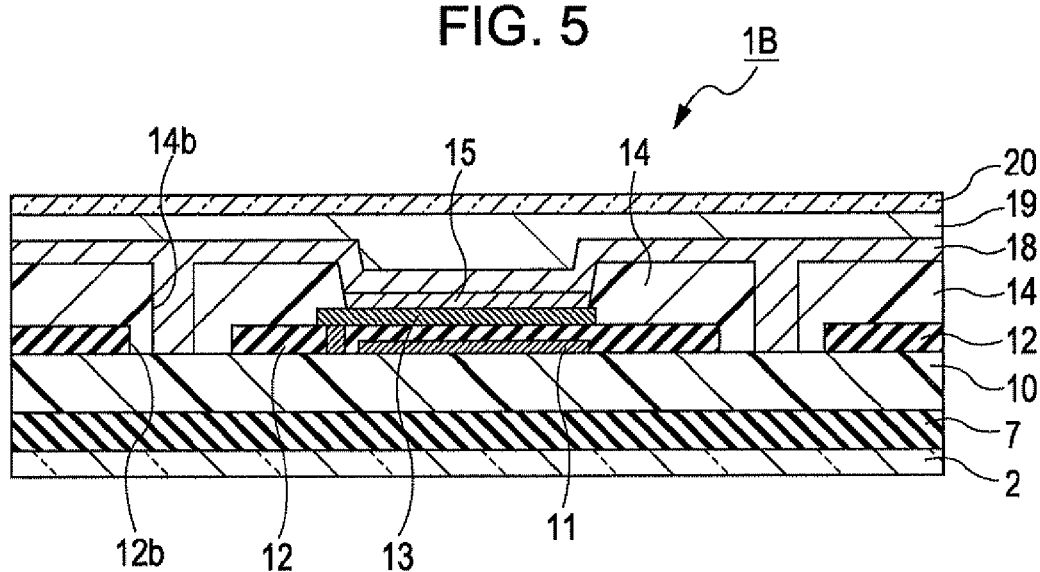
FIG. 5 is a sectional view schematically showing the structure of an organic EL device according to a second embodiment of the invention.

FIG. 5 is a diagram showing an organic EL device 1B according to a second embodiment of the invention. The organic EL device 1B according to this embodiment is partially the same as the organic EL device 1A according to the first embodiment; it differs in that the bank 14 has through-holes 14b (second through-holes). In this embodiment, therefore, the same components as those of the first embodiment are indicated by the same reference numerals, and a detailed description thereof will be omitted.

FIG. 5 is a schematic sectional view, corresponding to FIG. 4A, of the organic EL device 1B according to this embodiment. In the organic EL device 1B according to this embodiment, the bank 14 has the through-holes 14b extending through the bank 14 to reach the planarizing layer 10 via the through-holes 12b. The through-holes 14b are formed by, for example, photolithography before annealing.

In this embodiment, impurities that generate gas in the planarizing layer 10 can be released to the outside of the bank 14 through the through-holes 14b after the formation of the bank 14 during the production process. That is, the impurities in the planarizing layer 10 and the gas generated from the planarizing layer 10 can be directly released to the outside of the planarizing layer 10 without permeation through the bank 14.

In the organic EL device 1B according to this embodiment, therefore, the gas generated from the planarizing layer 10 during the production process can be more reliably released to the outside so that a deterioration in display quality due to accumulation of the gas can be more reliably prevented.

In this embodiment, it is possible to form through-holes 12b and 14b having substantially the same diameter and communicating with each other.

Electronic Apparatus

Figure 6:
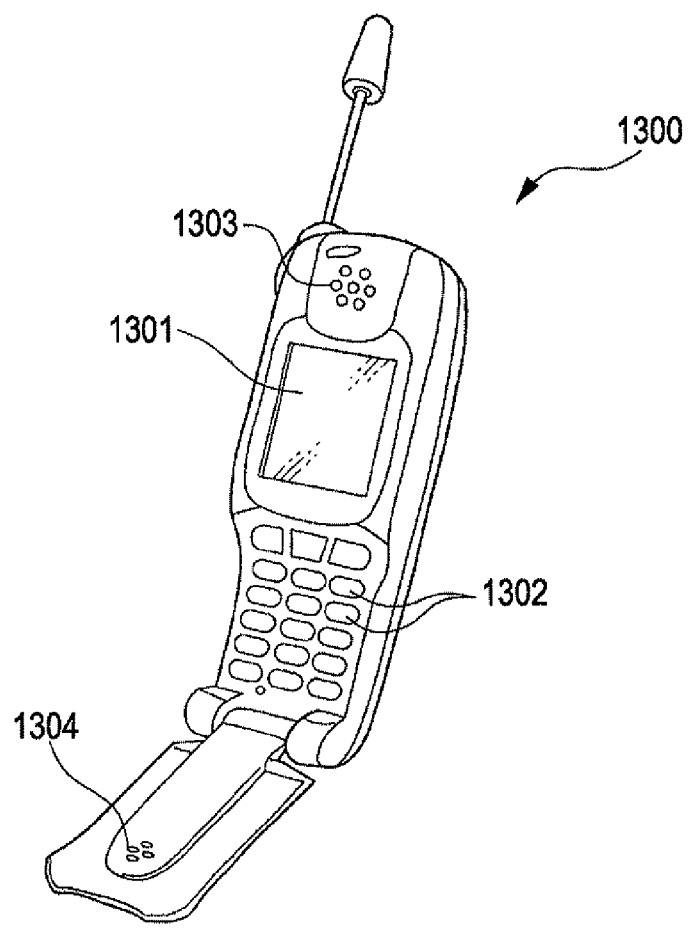
FIG. 6 is a perspective view showing an example of an electronic apparatus according to an embodiment of the invention.

Next, an electronic apparatus according to an embodiment of the invention will be described. FIG. 6 is a perspective view showing an example of an electronic apparatus including an organic EL device according to an embodiment of the invention. A cellular phone (electronic apparatus) 1300 shown in FIG. 6 includes a small display unit 1301 including an organic EL device according to an embodiment of the invention, a plurality of operating buttons 1302, an earpiece 1303, and a mouthpiece 1304. Thus, with an organic EL device according to an embodiment of the invention, a cellular phone including a display unit with superior reliability can be provided.

In addition to cellular phones, the organic EL devices according to the above embodiments are suitable for use as image display units for various other electronic apparatuses such as electronic books, projectors, personal computers, digital still cameras, television receivers, viewfinder- or monitor-equipped camcorders, car navigation systems, pagers, electronic organizers, calculators, word processors, workstations, video phones, POS terminals, and tough-panel-equipped devices. With the organic EL devices according to the above embodiments, electronic apparatuses including display units with high display quality and superior reliability can be provided.

Although the preferred embodiments of the invention have been described with reference to the attached drawings, it should be appreciated that the invention is not limited to these embodiments. The shapes, combinations, etc. of the individual components shown in the above embodiments are merely illustrative; various modifications are permitted depending on, for example, design requirements without departing from the spirit of the invention.

The entire disclosure of Japanese Patent Application No. 2009-026364, filed Feb. 6, 2009 is expressly incorporated by reference herein.

What is claimed is:

1. An organic electroluminescent device comprising:
a substrate;
a plurality of light-emitting elements disposed on the substrate and including first transparent electrodes, a second transparent electrode, and light-emitting layers held therebetween;
reflective layers disposed opposite the light-emitting layers with the first electrodes therebetween;
a first insulating film disposed between the substrate and the reflective layers and formed of an organic material; and
a second insulating film disposed between the first electrodes and the reflective layers so as to cover the reflective layers and the first insulating film, the second insulating film being formed of an inorganic material and the second insulating film having a first-through-hole at a position not overlapping the first electrodes in plan view, the first through-hole extending through the second insulating film to reach the first insulating film.

2. An electronic apparatus comprising the organic electroluminescent device according to claim 1.

3. The organic electroluminescent device according to claim 1, further comprising a bank disposed on the second insulating film so as to separate the light-emitting elements and formed of an organic material, the bank overlapping the first through-hole in plan view and being in contact with the first insulating film through the first through-hole.

4. An electronic apparatus comprising the organic electroluminescent device according to claim 3.

5. The organic electroluminescent device according to claim 3, wherein the bank has a second through-hole extending through the bank so as to be connected to the first through-hole.

6. An electronic apparatus comprising the organic electroluminescent device according to claim 5.

7. The organic electroluminescent device according to claim 3, wherein the first through-hole is strip-shaped so as to extend along at least part of the bank.

8. An electronic apparatus comprising the organic electroluminescent device according to claim 7.

* * * * *